(12) United States Patent
Guo

(10) Patent No.: US 11,435,409 B2
(45) Date of Patent: Sep. 6, 2022

(54) TEMPORARY OVERVOLTAGE AND GROUND FAULT OVERVOLTAGE PROTECTION BASED ON ARRESTER CURRENT MEASUREMENT AND ANALYSIS

(71) Applicant: RENSSELAER POLYTECHNIC INSTITUTE, Troy, NY (US)

(72) Inventor: Huan Guo, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 72 days.

(21) Appl. No.: 16/960,972

(22) PCT Filed: Jan. 9, 2019

(86) PCT No.: PCT/US2019/012881
§ 371 (c)(1),
(2) Date: Jul. 9, 2020

(87) PCT Pub. No.: WO2019/139973
PCT Pub. Date: Jul. 18, 2019

(65) Prior Publication Data
US 2021/0083468 A1   Mar. 18, 2021

Related U.S. Application Data

(60) Provisional application No. 62/615,352, filed on Jan. 9, 2018.

(51) Int. Cl.
*H02H 3/22* (2006.01)
*G01R 31/08* (2020.01)
(Continued)

(52) U.S. Cl.
CPC ........... *G01R 31/52* (2020.01); *H02H 1/0092* (2013.01); *H02H 3/22* (2013.01); *G01R 31/08* (2013.01); *G01R 31/085* (2013.01); *G01R 31/086* (2013.01)

(58) Field of Classification Search
CPC .... G01R 31/08; G01R 31/085; G01R 31/086; H02H 3/22
See application file for complete search history.

(56) References Cited

U.S. PATENT DOCUMENTS

| | | | | |
|---|---|---|---|---|
| 5,220,480 A | * | 6/1993 | Kershaw, Jr. | H01C 1/14 361/117 |
| 5,428,549 A | * | 6/1995 | Chen | G01R 31/088 361/80 |

(Continued)

FOREIGN PATENT DOCUMENTS

| | | | |
|---|---|---|---|
| WO | 2017203099 A1 | 11/2017 | |
| WO | WO-2017203099 A1 * | 11/2017 | ........... G01R 31/085 |

OTHER PUBLICATIONS

International Search Report and The Written Opinion of the International Searching Authority, International Application No. PCT/US2019/012881, dated Mar. 28, 2019.

*Primary Examiner* — Gary A Nash
(74) *Attorney, Agent, or Firm* — Murtha Cullina LLP; Anthony P. Gangemi

(57) ABSTRACT

A detection scheme for temporary overvoltages and/or ground fault overvoltages in electric power systems is described. Current passing through a surge arrestor component of the power system is monitored. An algorithm for identifying one or more frequency components of the measured current signal is performed to screen out unwanted harmonics. In some embodiments, this is a frequency domain analysis. The frequency component(s) of the current signal is then compared to a calculated pickup current or pickup voltage of the system to determine if system protection steps should be undertaken.

17 Claims, 8 Drawing Sheets

(51) Int. Cl.
*G01R 31/52* (2020.01)
*H02H 1/00* (2006.01)

(56) References Cited

U.S. PATENT DOCUMENTS

| | | | | |
|---|---|---|---|---|
| 5,485,093 | A * | 1/1996 | Russell | H02H 1/0015 |
| | | | | 324/522 |
| 5,694,281 | A | 12/1997 | Roberts et al. | |
| 7,902,813 | B2 * | 3/2011 | Kojovic | H02H 1/0007 |
| | | | | 324/127 |
| 2010/0097733 | A1 * | 4/2010 | E. | H02H 1/0015 |
| | | | | 361/42 |
| 2011/0178741 | A1 * | 7/2011 | Saha | G01R 31/085 |
| | | | | 702/59 |
| 2015/0109077 | A1 * | 4/2015 | Tomimbang | H02H 1/0015 |
| | | | | 335/7 |

* cited by examiner

| 102 | Measuring current passing through a surge arrestor |

| 104 | Calculating one or more frequency components of the measured current |

| 106 | Using the calculated one or more frequency components to calculate a magnitude of one or more target current variables |

| 108 | Comparing the magnitude of the one or more target current variables to an overvoltage capability of the arrestor |

| 110 | If the magnitude of the one or more target current variables exceeds the overvoltage capability of the arrestor, initiating overvoltage protection in the electric power system |

FIG. 5

| 106a | Calculating one or more Fourier Series constants for the one or more frequency components of an arrestor current based on one or more segments of a V-I characteristic curve for the surge arrestor |

| 106b | Calculating a pickup current using a pickup voltage and the one or more Fourier series constants |

| 106c | Comparing the magnitude of the one or more target current variables to the pickup current |

FIG. 6

| 104a | Calculating one or more Fourier Series constants for the one or more frequency components of an arrestor current based on one or more segments of a V-I characteristic curve for the surge arrestor |

| 106a | Calculating a magnitude of a zero sequence component in the measured current |

| 108a | Comparing the magnitude of the zero sequence component to an overvoltage capability of the arrestor |

FIG. 7

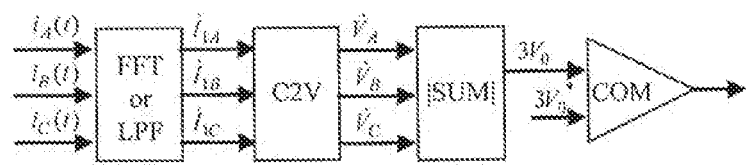

FIG. 8

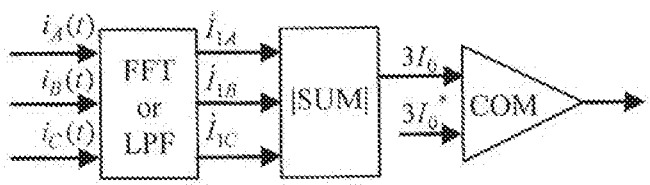

FIG. 9

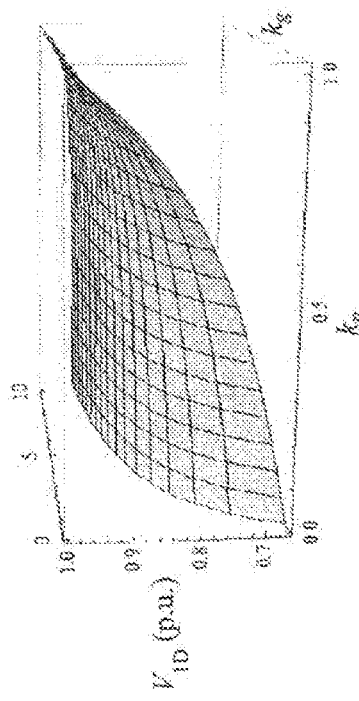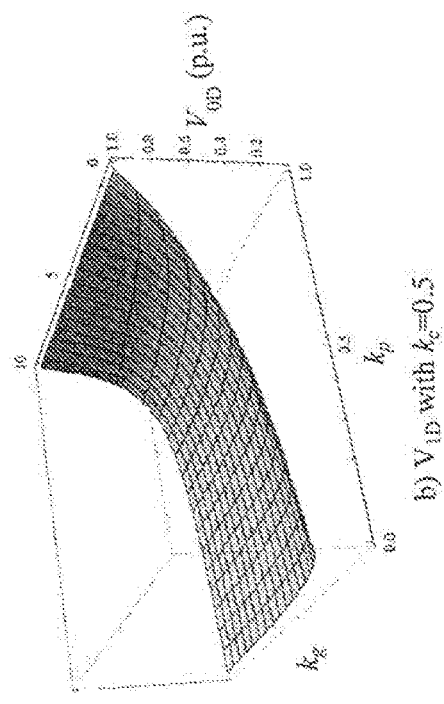
FIG. 10
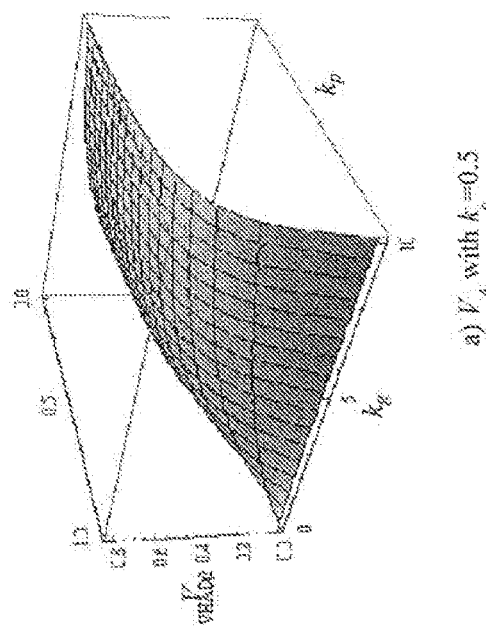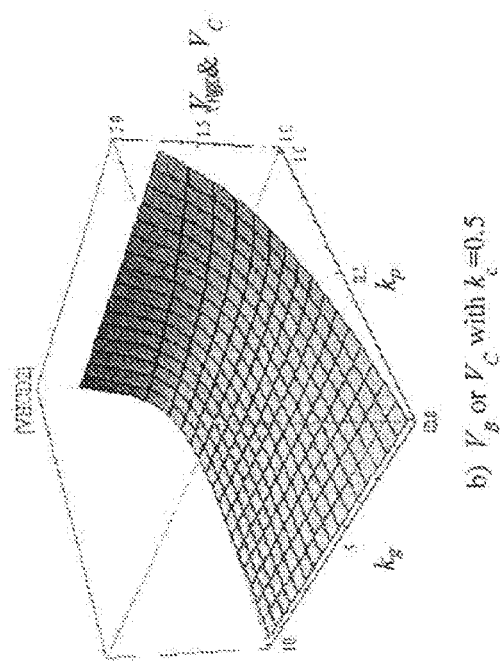
FIG. 11

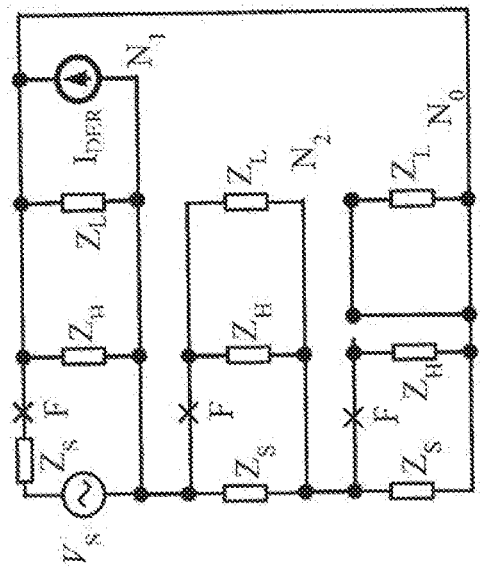
a) The first interval
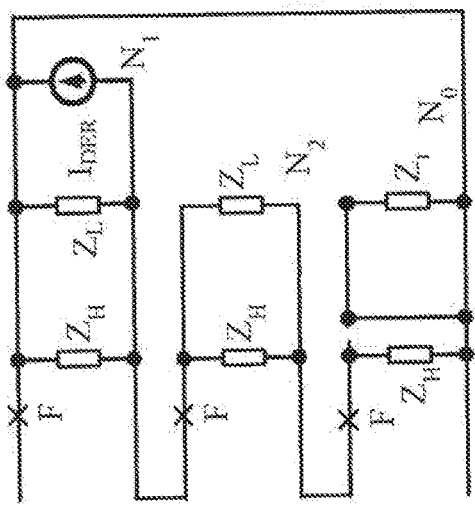
b) The second interval
FIG. 12
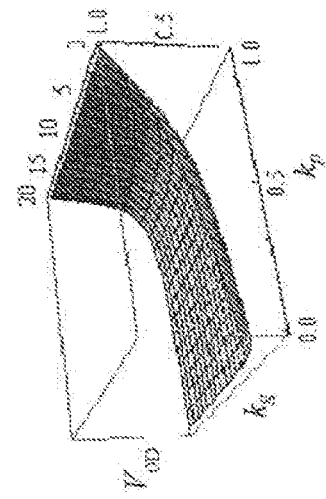
a) $V_{1D}$ with $k_c$=0.5
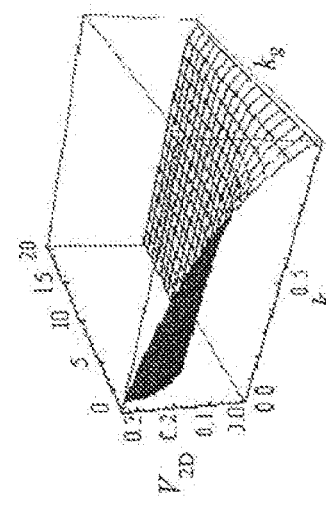
b) $V_{2D}$ with $k_c$=0.5
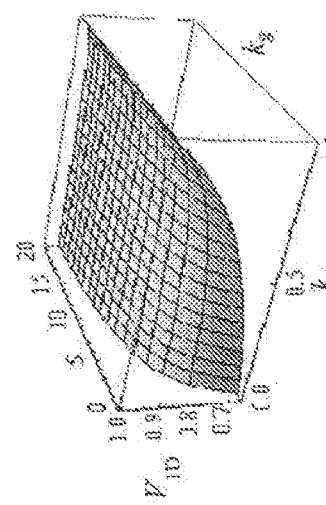
b) $V_{0D}$ with $k_c$=0.5
FIG. 13

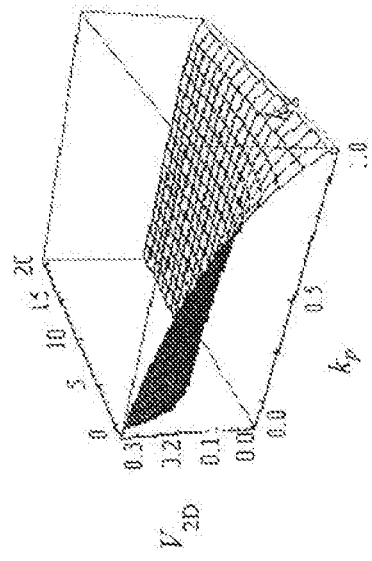
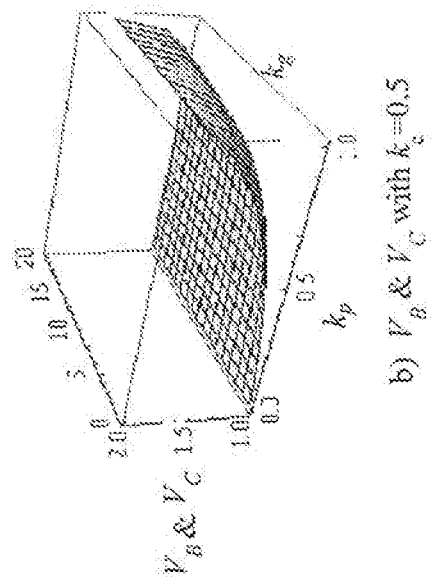
FIG. 14
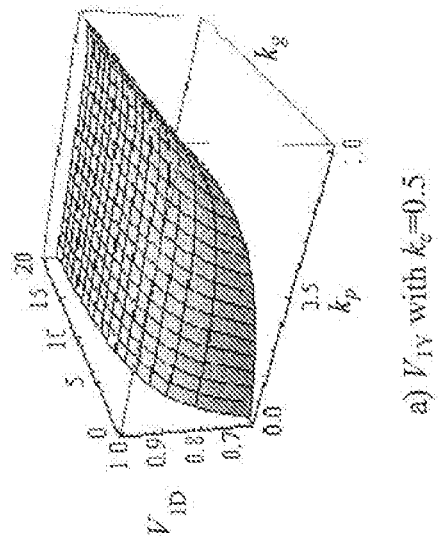
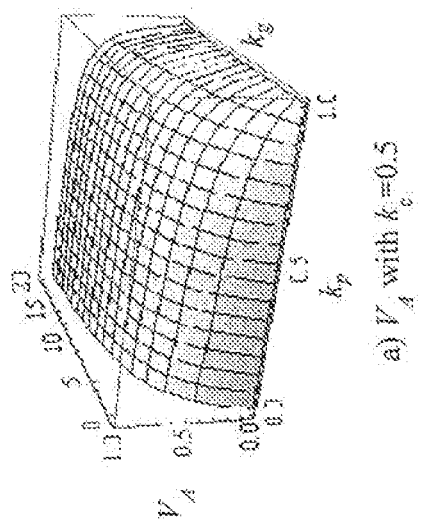
FIG. 15

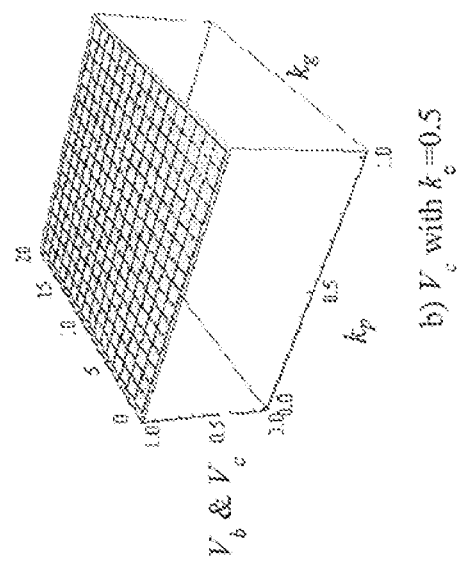
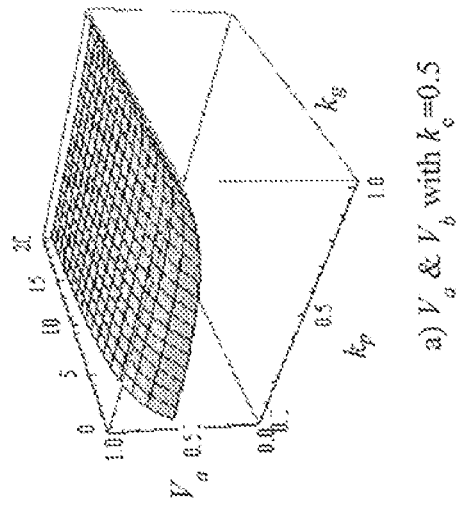
FIG. 16

TEMPORARY OVERVOLTAGE AND GROUND FAULT OVERVOLTAGE PROTECTION BASED ON ARRESTER CURRENT MEASUREMENT AND ANALYSIS

CROSS REFERENCE TO RELATED APPLICATION(S)

This application claims the benefit of U.S. Provisional Application No. 62/615,352, filed Jan. 9, 2018, which is incorporated by reference as if disclosed herein in its entirety.

FIELD

The present disclosure relates to temporary overvoltage ("TOV") and ground fault overvoltage ("GFOV") protection approaches, including the use of arrester current measurement and analysis.

BACKGROUND

With the increasing application of renewable energy sources and other Distributed Energy Resources (DERs) in electric power systems, TOV and GFOV protection and detection methods have become increasingly important for developers and project leads working to meet interconnection guidelines. A typical electrical power system with photovoltaic plants ("PV") and DER components is shown in FIG. 1. The PV plants or other DERs are installed on the Wye (Yg) side of a substation transformer, with a sub-transmission or transmission line on the Delta side (Δ).

In the event of a single line-to-ground fault (SLGF), the breaker on the transmission line will trip several cycles later. Meanwhile, the PVs/DERs on the Wye side continue to output electrical power until an islanding condition is detected. However, before the islanding condition is detected, a fault overvoltage may appear on the delta side of the transformer. The overvoltage can increase to as high as 173% of the system nominal voltage. This increased phase-to-ground voltage can cause rapid failure of surge arresters and can cause damage to other system equipment.

Generally, when the DER generation reaches a threshold ratio (such as 2/3) of the distribution minimum load, utilities require a protective relaying package to be installed on the Delta side of the transformer. Typically, such a protective relaying package is a voltage (or "potential") transformer ("PT")-based zero sequence (or ground fault) overvoltage ("3V0") protection. This type of 3V0 protection is shown schematically in FIG. 1. The 3V0 protection generally includes a three-phase high voltage PT for voltage measurement and a relay for TOV/GFOV detection and protection. As shown in FIG. 1, it is also typical for the PT to be coupled to the high-voltage transmission lines.

The installation of typical PT-based 3V0 protection can be very expensive and requires a lengthy timeline for construction. These aspects have become significant barriers to PV and other DERs installation in a variety of locations. On the other hand, with increasing demand for DER, it has become easier to reach the threshold ratio at which the 3V0 protection is required. Thus, there is a need to make the installation of sufficient TOV and GFOV protection easier and less costly.

SUMMARY

Embodiments of the present invention include methods, systems, devices, and computer program products for providing TOV or GFOV protection based on the monitoring and analysis of current through a surge arrestor. In some embodiments, the surge arrestor is a metal oxide ("MO") arrestor.

An exemplary embodiment of a protection system according to the present invention includes one or more Current Sensors (CSs), a microprocessor-based fault detection device, and a relay. The one or more CSs are used to measure the surge arrester currents, which vary with the variation of arrester terminals. The measured currents can be used to detect a TOV or GFOV event in the electric power system. In some embodiments, the microprocessor is used to screen out necessary frequency components of the current signal(s) and perform a protection algorithm to determine if protection of the system is needed. In some embodiments, the microprocessor is not needed if an advanced relay has the function to filter the current harmonics and perform the required algorithm for fault detection. In some embodiments, a protection signal is sent by the microprocessor to a relay and/or an upper distribution protection system for execution of additional system protection steps. In some embodiments, the protection signal is used to turn off the breaker on the distribution side, so that a GFOV on transformer delta side is eliminated.

The arrester current contains numerous harmonic components due to the non-linear V-I characteristic of the arrestor. According to embodiments of the invention, one or more processors will perform a circuit protection function comprising, in some embodiments, a real-time FFT algorithm and a 3V0 or 3I0 (zero-sequence current) algorithm. The former is used to extract the fundamental component (or another frequency component) from measured current signals, and the latter is used to determine if protection steps should be taken.

An exemplary method for initiating overvoltage protection in an electric power system according to an embodiment of the invention, includes: measuring current passing through a surge arrestor; calculating one or more frequency components of the measured current; using the calculated one or more frequency components to calculate a magnitude of one or more target current variables; comparing the magnitude of the one or more target current variables to an overvoltage capability of the arrestor; and, if the magnitude of the one or more target current variables exceeds the overvoltage capability of the arrestor, initiating overvoltage protection in the electric power system. In some embodiments, a frequency domain analysis is used to calculate the frequency components of the measured current.

In some embodiments, in the event of a GFOV, the calculated frequency components are used to calculate the 3I0, or zero-sequence value of the current for the frequency components. The amplitude of the zero-sequence component is calculated from the frequency component of the measured current, and this amplitude (also referred to as a magnitude) is used for GFOV protection. The zero sequence component is compared to the overvoltage capability of the arrestor. In such embodiments, one or more zero-sequence components of the measured current is the target current variable(s), as referred to herein. In some, embodiments, the desired frequency component is the fundamental component of the measured current. In other embodiments, the desired frequency component is the fundamental component of the of the measured current.

In other embodiments, such as for TOV protection, the target current variable(s) is the amplitude (also referred to as magnitude) of the frequency components of the measured current, which is the fundamental component in some embodiments, and other harmonic components in other embodiments.

In some embodiments, the frequency component of the measured current that is calculated is the fundamental component of the measured current signal. In other embodiments, the calculated frequency component is one or more of the harmonic components. For example, in some embodiments for TOV protection, the calculated frequency component is the 3rd harmonic component. In some embodiments for GFOV protection, the calculated frequency component is the 5th harmonic component. In other embodiments, other harmonics are used.

Embodiments of the present invention can provide a number of cost and efficiency benefits over traditional overvoltage protection schemes. Embodiments of the invention will now be described with reference to the attached drawings.

BRIEF DESCRIPTION OF THE DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings.

FIG. 5 illustrates method steps according to an embodiment of the invention.

FIG. 6 illustrates additional method steps according to an embodiment of the invention.

FIG. 7 illustrates additional method steps according to an embodiment of the invention.

FIG. 8 is a functional diagram of a 3V0 algorithm according to an embodiment of the invention.

FIG. 9 is a functional diagram of a 3I0 algorithm according to an embodiment of the invention.

FIG. 10a is a graph showing the amplitude of sequence-domain transformer delta-side voltages for the positive-sequence as part of an analysis associated with setting a pickup voltage for a 3V0 algorithm according to an embodiment of the invention.

FIG. 10b is a graph showing the amplitude of sequence-domain transformer delta-side voltages for the zero-sequence as part of an analysis associated with setting a pickup voltage for a 3V0 algorithm according to an embodiment of the invention.

FIG. 11a is a graph showing the amplitude of phase-domain transformer delta-side voltages for phase A as part of an analysis associated with setting a pickup voltage for a 3V0 algorithm according to an embodiment of the invention.

FIG. 11b is a graph showing the amplitude of phase-domain transformer delta-side voltages for phase B & C as part of an analysis associated with setting a pickup voltage for a 3V0 algorithm according to an embodiment of the invention.

FIG. 12a is a schematic diagram of the sequence network of a single line-to-ground fault on the transmission side of a system such as shown in FIG. 1 during the interval between the fault and the transmission line breaker tripping as part of an analysis associated with setting a pickup voltage for a 3V0 algorithm according to an embodiment of the invention.

FIG. 12b is a schematic diagram of the sequence network of a single line-to-ground fault on the transmission side of a system such as shown in FIG. 1 during the interval between the transmission line breaker tripping and the DERs shutting down as part of an analysis associated with setting a pickup voltage for a 3V0 algorithm according to an embodiment of the invention.

FIGS. 13a, b, and c show graphs of the amplitudes of sequence-domain voltage on delta side per unit (pu): a) positive sequence, b) negative sequence, and c) zero sequence as part of an analysis associated with setting a pickup voltage for a 3V0 algorithm according to an embodiment of the invention.

FIGS. 14a and b show graphs of the amplitudes of phase-domain voltage on delta-side (pu): a) phase A voltage, and b) phase B & phase C voltages as part of an analysis associated with setting a pickup voltage for a 3V0 algorithm according to an embodiment of the invention.

FIGS. 15a and b show graphs of the amplitudes of sequence-domain voltages on wye side (pu): a) positive-sequence, b) negative-sequence as part of an analysis associated with setting a pickup voltage for a 3V0 algorithm according to an embodiment of the invention.

FIGS. 16a and b show graphs of the amplitudes of phase-domain voltages on Wye-side (pu): a) phase A voltage, and b) phase B & phase C voltages as part of an analysis associated with setting a pickup voltage for a 3V0 algorithm according to an embodiment of the invention.

DETAILED DESCRIPTION

Figure 2:
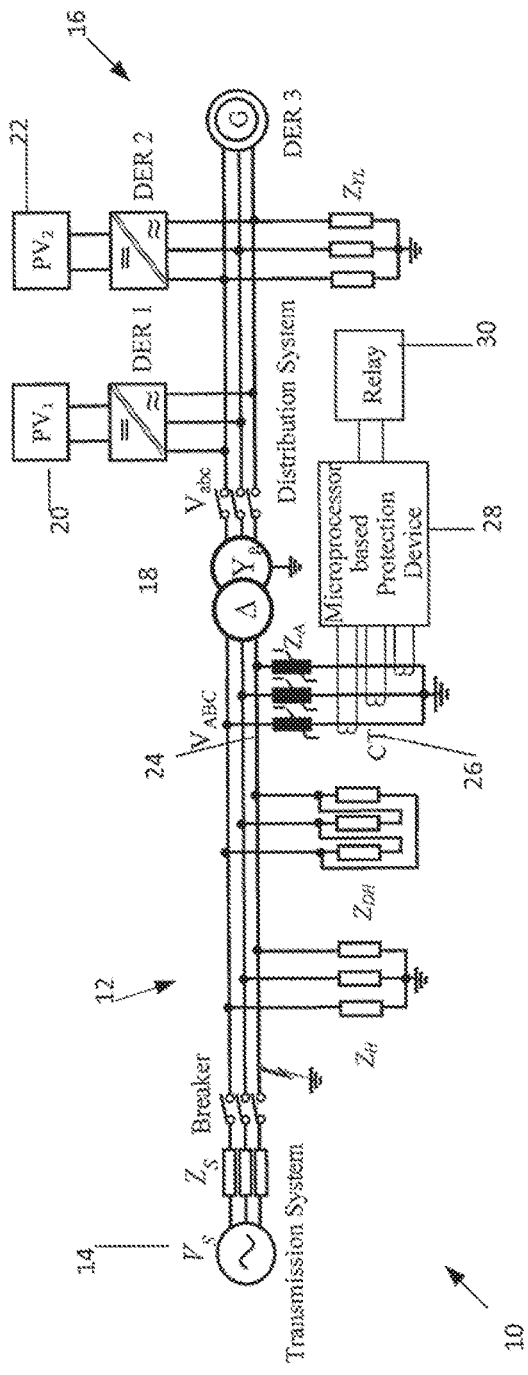
FIG. 2 is a schematic view of a three-phase electric power system and a protection system according to an embodiment of the invention.

A three-phase electrical power system 10 is shown schematically in FIG. 2 and includes a Delta side 12, which includes the transmission or sub-transmission system 14, and a Wye side 16, including a distribution system. The two sides are separated by a Delta-Wye transformer 18. Two photovoltaic plants 20 and 22 are shown as PV1 and PV2, and three DERs are also shown on the distribution side. In other systems to which embodiments of the present invention are applied, different arrangements of PVs, DERs, and other components are present in the system. On the transmission side, a surge arrestor 24 is shown schematically with impedance $Z_A$. In this system, the surge arrestor 24 is a three-phase metal-oxide arrester (MOA).

Figure 1:
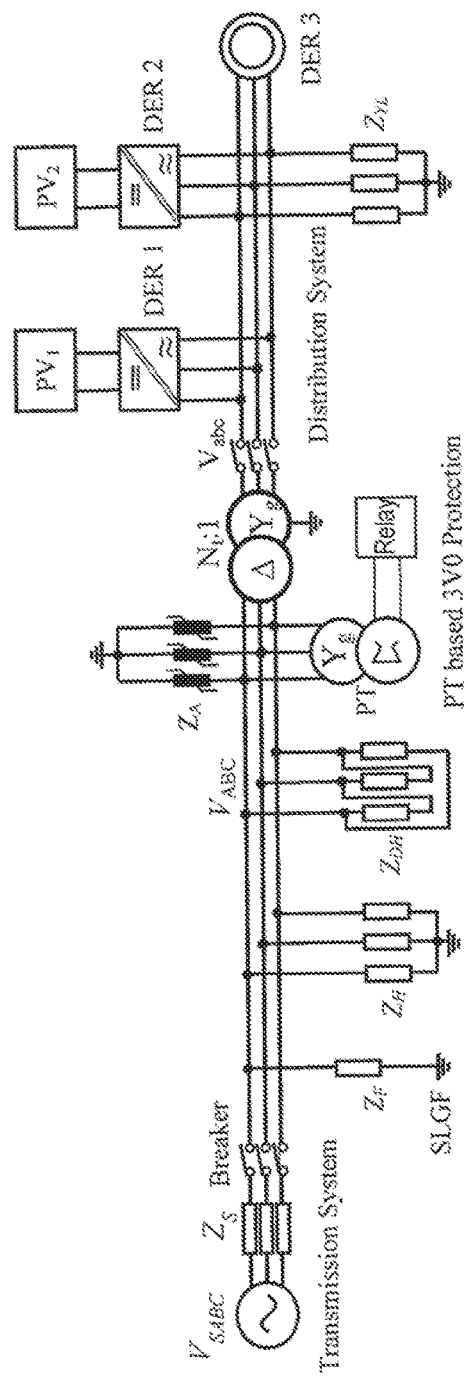
FIG. 1 is a schematic view of a three-phase electric power system with a Delta-Wye transformer and a PT-based 3V0 protection system.

Both FIGS. 1 and 2 show the system impedance represented as $Z_S$, while $Z_H$ represents the Wye (ground)-connected load impedance on the transmission (Delta) side, $Z_{DH}$ represents the delta-connected load impedance on the transmission (Delta) side, $Z_{YL}$ represents the load impedance on the distribution (Wye) side, and $Z_F$ represents the fault impedance.

FIG. 2 also shows a schematic view of a first embodiment of a system for initiating overvoltage protection in an electric power system. The system comprises a current sensing device adapted to be coupled to a surge arrestor component of the power system. In the embodiment shown in FIG. 2, the current sensing device comprises a three-phase current transformer ("CT") 26 coupled to the three conductors of the system on the low-voltage side of the arrestor 24. That is, between a voltage barrier of the arrestor and a ground terminal associated with the arrestor. The three-phase CT is used to measure the current flowing through the MOA 24. In some embodiments, the CT comprises three current sensors, with each sensor coupled to one of the conductors. In other embodiments, the CT comprises one or more current sensors mounted on a support post of the arrestor and uses the grounding cable as the primary winding.

In some embodiments, three high-accuracy mA level current sensors are used for arrester current measurement and are selected to be able to withstand the impact of high transient current, which may be caused by lightning or circuit switching. In some embodiments, the system comprises one or more current sensors adapted to measure current in in the range from about 0.1 mA to about 20 mA, which range corresponds to the arrester current under normal voltage level up to a TOV/GFOV pickup level. In some embodiments, low bandwidth current sensors are employed, since, as described below only the fundamental component of the current signal is used in some embodiments. Common current sensors with wider bandwidths are used in other embodiments, since, as also described below, signal filtering functions are used to isolate the fundamental component of the current signal. As those of skill in the art will appreciate, the current sensors should be selected or designed with environment and electromagnetic compatibility, installation compliance, measuring signal transmission, and other important aspects of the installation requirements in mind.

FIG. 2 also shows a microprocessor-based protection device 28, coupled to the CT 26. In some embodiments, the microprocessor-based protection device 28 is a smart protection device (SPD) that comprises one or more processors and one or more data storage devices in communication with the one or more processors. In some embodiments, the data storage device stores a set of programming instructions for execution by the one or more processors. In some embodiments the processors and data store are bundled in a package, in other embodiments they are remote from one another and include hardware, firmware, and/or software to permit communication between them over significant distances.

The microprocessor device 28 is adapted to, via programming instructions, receive a measurement of current passing through the surge arrestor. In some embodiments, this comprises receiving signals from the current sensors that correlate to the amount of current flowing through the arrestor 24. As described in further detail below, the device 28 is also used to screen out and/or calculate one or more frequency components of the measured current; to use the calculated frequency component(s) to calculate a magnitude of one or more target current variables; and to compare the magnitude of the one or more target current variables to the overvoltage capability of the surge arrestor; and, if the magnitude of the one or more target current variables exceeds the overvoltage capability of the arrestor, to initiate overvoltage protection in the electric power system.

Figure 4:
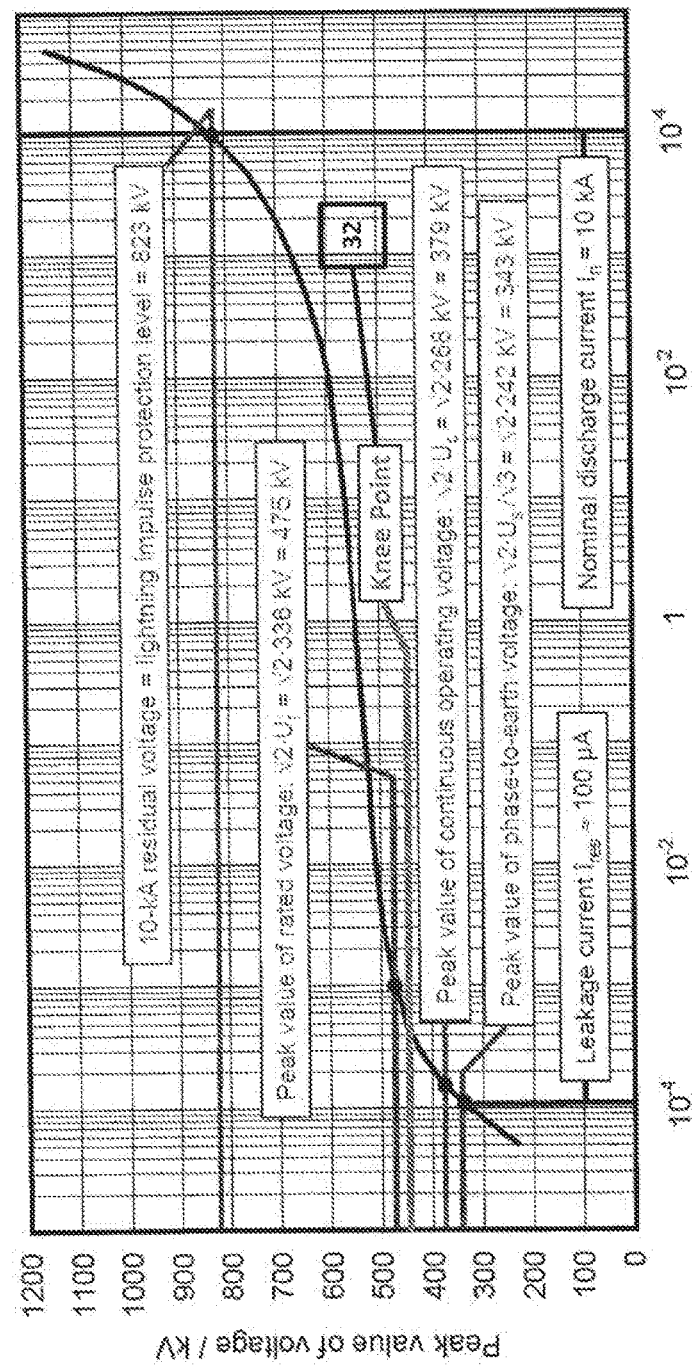
FIG. 4 is a chart showing a sample V-I characteristic of an exemplary metal oxide surge arrestor in a solidly earthed neutral 420 kV system.

In some embodiments, the fundamental component of the measured current is the desired frequency component of the measured current signal. Surge arrestor current contains numerous harmonic components due to the non-linear nature of the V-I characteristic of the arrestor. A complete arrester can be represented by a simplified model shown in FIG. 3, which shows a stray capacitance and a non-linear resistance in parallel. The stray capacitance of an exemplary arrestor is 75 pF kV/cm$^2$, and the capacitive current ranges from 0.5 mA to 3 mA at peak, depending on the arrester diameter and voltage. Based on this model and arrestor resistor characteristic, the V-I characteristic of the arrester resistance can be described by a multi-segment function:

$$i_r = k_a v^{\alpha_k} \tag{1}$$

where subscript k=1, 2, 3 . . . , represents the number of the V-I segment. A complete V-I characteristic curve contains multiple segments and is shown in FIG. 4.

In order to isolate the desired frequency component of the measured current, in some embodiments, calculating the frequency component of the measured current signal comprises performing a frequency-domain analysis on the measured current signal. In some embodiments, the frequency-domain analysis comprises performing a real-time Fast Fourier Transform (FFT) algorithm. This algorithm includes, in some embodiments, calculating one or more Fourier Series constants for one or more frequency components of the measured current based on one or more segments of a V-I characteristic curve for the surge arrestor; and using the one or more Fourier Series constants and derived ratios of the one or more frequency components of the measured current to one or more frequency components of voltage in the surge arrestor and of the one or more frequency components of the measured current to a current peak to calculate the one or more frequency components of the measured current. Examples of this portion of the protection algorithm are explained in additional detail below. In some embodiments, the zero-sequence current component is obtained from the frequency-domain fundamental components.

Once the desired frequency component of the measured current is identified, it must be used by the system to determine if an overvoltage event has occurred such that circuit protection should be initiated. The system is therefore adapted to (via programming instructions) use the one or more frequency components to calculate a magnitude of one or more target current variables and compare the magnitude of the one or more target current variables to an overvoltage capability of the arrestor. In some embodiments, this process includes: calculating one or more Fourier Series constants for the one or more frequency components of an arrestor current based on one or more segments of a V-I characteristic curve for the surge arrestor (if this has not already been done); calculating a pickup current using a pickup voltage and the one or more Fourier series constants; and comparing the magnitude of the one or more target current variables to the pickup current. In some embodiments, this process is implemented for initiating TOV protection. In some embodiments, the target current variable is the magnitude of the calculated frequency component of the measured current. In some embodiments, the calculated frequency component is the fundamental component. In other embodiments, the calculated frequency component is another harmonic component, such as the $3^{rd}$, $5^{th}$ or other harmonic component.

In other embodiments, this process includes: calculating one or more Fourier Series constants for the one or more frequency components of an arrestor current based on one or more segments of a V-I characteristic curve for the surge arrestor; using the calculated one or more frequency components to calculate a magnitude of one or more target current variables comprises calculating a magnitude of a zero sequence component in the measured current; wherein the step of comparing the magnitude of the one or more target current variables to an overvoltage capability of the arrestor comprises comparing the magnitude of the zero sequence component to an overvoltage capability of the arrestor; and wherein the step of initiating overvoltage protection comprises initiating GFOV protection. In some embodiments, this process is implemented for initiating GFOV protection. Additional details of these processes are described below.

Based on the comparison, if the magnitude of the one or more target current variables exceeds the overvoltage capability of the arrestor, the system will initiate overvoltage protection in the electric power system. In some embodiments, this includes sending a signal to a distribution protection system associated with the electric power system to initiate breaking one or more circuits in the electric power system. In some embodiments, such a signal (sometimes called a protection signal) is sent by the device 28.

Thus, in preferred embodiments, the processor-based device executes the real-time FFT algorithm for extracting the desired frequency component(s) of the current and the algorithm for TOV/GFOV protection. As described in the examples, below, the algorithm is a 3V0 algorithm in some embodiments, and is a 3I0 algorithm in other embodiments. In some embodiments, systems according to the present invention include operator interfaces, signal input and output ports and processing equipment, status and trip target LEDs, systems for coordination with upper relay and protection systems, and equipment for communication with upper monitoring systems.

The embodiment shown in FIG. 2 includes a relay 30, as do many other embodiments of the present invention. The relay 30 is typically in communication with the one or more processors. In some embodiments, the programming instructions further comprise instructions for sending a signal to initiate breaking one or more circuits in the electric power system. The relay is adapted to receive the signal and break one or more circuits in the electric power system.

In addition to the protection signal being sent to the relay, in some embodiments, the signal is sent to an upper distribution protection system so that further protection steps can be executed. One example of such a protection step is to open a breaker on the distribution side to that, for example, a GFOV on the transformer Delta side is eliminated. Since many modern relays are also microprocessor devices, it is possible in some embodiments to combine the device 28 and relay 30 into a single device. For example, in some embodiments, the processor-based device is equipped to perform the functions of the relay, and in other embodiments the relay is equipped to perform the algorithms described herein.

FIG. 5 illustrates the steps for initiating overvoltage protection in an electric power system according to an embodiment 100 of the present invention. Step 102 comprises measuring current passing through a surge arrestor; step 104 comprises calculating one or more frequency components of the measured current; step 106 comprises using the calculated one or more frequency components to calculate a magnitude of one or more target current variables; step 108 comprises comparing a magnitude of the one or more target current variables to an overvoltage capability of the arrestor; and step 110 comprises, if the magnitude of the one or more target current variables exceeds the overvoltage capability of the arrestor, initiating overvoltage protection in the electric power system. As discussed above, in some embodiments, the step 104 of calculating one or more frequency components further comprises performing a frequency-domain analysis on the measured current, and in some embodiments the frequency-domain analysis comprises performing a real-time Fast Fourier Transform algorithm.

In some embodiments, the Fast Fourier Transform algorithm includes calculating one or more Fourier Series constants for the one or more frequency components of the measured current based on one or more segments of a V-I characteristic curve for the surge arrestor; and using the one or more Fourier Series constants and derived ratios of the one or more frequency components of the measured current to one or more frequency components of voltage in the surge arrestor and of the one or more frequency components of the measured current to a current peak to calculate the one or more frequency components of the measured current.

FIG. 6 shows additional steps that comprise step 106 of comparing a magnitude of the one or more target current variables to an overvoltage capability of the arrestor in some embodiments. Step 106a comprises calculating one or more Fourier Series constants for the one or more frequency components of an arrestor current based on one or more segments of a V-I characteristic curve for the surge arrestor; step 106b comprises calculating a pickup current using a pickup voltage and the one or more Fourier series constants; step 106c comprises comparing the magnitude of the one or more target current variables to the pickup current. In some embodiments, the step of initiating overvoltage protection comprises initiating TOV protection.

FIG. 7 shows additional steps according to another embodiment. Step 104a is a further refinement of step 104, where the step of calculating one or more frequency components of the measured current comprises calculating one or more Fourier Series constants for the one or more frequency components of an arrestor current based on one or more segments of a V-I characteristic curve for the surge arrestor; step 106e is a further refinement of step 106, where the step of using the calculated one or more frequency components to calculate a magnitude of the one or more target current variables comprises calculating a magnitude of a zero sequence component in the measured current; and step 108a is a further refinement of step 108 where the step of comparing the magnitude of the one or more target current variables to an overvoltage capability of the arrestor comprises comparing the magnitude of the zero sequence component to an overvoltage capability of the arrestor. In some embodiments, the step of initiating overvoltage protection comprises initiating GFOV protection.

Another embodiment of the invention is provided as a computer programming product for initiating overvoltage protection in an electric power system, embodied on a computer readable medium and comprising a set of programming instructions. The programming instructions comprise instructions for: receiving a measurement of current passing through a surge arrestor in the electric power system in the form of a measured current signal; calculating one or more frequency components of the measured current signal; using the calculated one or more frequency components to calculate one or more target current variables; comparing a magnitude of the one or more target current variables to an overvoltage capability of the surge arrestor; and if the magnitude of the one or more target current variables exceeds the overvoltage capability of the arrestor, initiating overvoltage protection in the electric power system.

In some embodiments, the instructions for initiating overvoltage protection further comprise sending a signal to a distribution protection system associated with the electric power system to initiate breaking one or more circuits in the electric power system. In some embodiments, the instructions for calculating a fundamental one or more frequency components further comprises performing a frequency-domain analysis on the measured current signal, which comprises performing a real-time Fast Fourier Transform algorithm, comprising: calculating one or more Fourier Series constants for the one or more frequency components of the measured current signal based on one or more segments of a V-I characteristic curve for the surge arrestor; using the one or more Fourier Series constants and derived ratios of the one or more frequency components of the measured current signal to a one or more frequency components of voltage in the surge arrestor and of the one or more frequency components of the measured current signal to a current peak to calculate the one or more frequency components of the measured current; calculating a pickup current using a pickup voltage and the one or more Fourier series constants; and comparing the magnitude of the one or more target current variables to the pickup current.

In some embodiments, the instructions for calculating one or more frequency components further comprises performing a frequency-domain analysis on the measured current signal, which comprises performing a real-time Fast Fourier Transform algorithm, comprising: calculating one or more Fourier Series constants for the one or more frequency components of the measured current signal based on one or more segments of a V-I characteristic curve for the surge arrestor; and using the one or more Fourier Series constants and derived ratios of the one or more frequency components of the measured current signal to one or more frequency components of voltage in the surge arrestor and of the one or more frequency components of the measured current signal to a current peak to calculate the one or more frequency components of the measured current; wherein the instructions for using the calculated one or more frequency components to calculate a magnitude of the one or more target current variables comprises calculating a magnitude of a zero sequence component in the measured current; and wherein the instructions for comparing the magnitude of the one or more target current variables to an overvoltage capability of the arrestor further comprises comparing the magnitude of the zero sequence value to an overvoltage capability of the arrestor; and wherein the step of initiating overvoltage protection comprises initiating GFOV protection.

In another embodiment of the present invention, a system for initiating overvoltage protection in an electric power system is provided that comprises: one or more data receiving devices; one or more data transmitting devices; one or more processors in communication with the one or more data receiving devices and the one or more data-transmitting devices; and one or more data storage devices, in communication with the one or more processors, and containing a set of programming instructions for execution by the one or more processors. The programming instructions comprise instructions as described above and herein. Systems in such embodiments take the form of controller component adapted to couple to and communicate with the components of the electric power system, including a surge arrestor, relay devices, and other protection systems. Data receiving devices include any structure or technology for accepting transmitted data, including data ports, wireless antennas, and similar and associated equipment. Likewise, data transmitting devices include any structure or technology for sending data, including data ports, wireless antennas, and similar and associated equipment. The data receiving devices are adapted to receive signals from current sensing devices that may be coupled to a surge arrestor in the electric power system. Data transmitting devices are adapted to send signals to or otherwise communicate with relays, upper distribution protection systems, and other components of the power system.

The use of measured arrester current for TOV/GFOV protection according to embodiments of the present invention has potential advantages. For example, arrester overvoltage capability is determined by its energy dissipation capability, which is directly related to the current flowing through it. Arrester aging causes an increase of leaking current through the arrester under normal conditions, which degrades the arrester overvoltage withstanding capability. With an overvoltage protection based on the pickup value of the arrester current, the influence of the arrester aging can be reduced. From this standpoint, current monitoring has a potential advantage for TOV/GFOV protection. Additionally, in the TOV region of the V-I characteristic curve, the arrester current increases significantly with the increase of voltage amplitude, which provides a distinct signal for a positive TOV detection.

The use of measured arrester current for TOV/GFOV protection also has potential advantages with respect to the cost and difficulty of installation. Current sensing according to some embodiments of the invention, takes place in a low-voltage portion of the circuit. This significantly reduces the cost and difficulty of Potential Transformer (PT) based installation and measurement under high voltage or ultra high voltage environments.

The following examples provide additional details on analysis and algorithm steps utilized in embodiments of the invention. These examples are not intended to limit the scope of the invention.

Example 1

The following is an example of calculation steps for isolating the fundamental frequency component of a measured arrester current. Based on the simplified model of the surge arrestor in FIG. 3, the V-I characteristic in FIG. 4, and Equation (1), above, this example ignores the effect of stray capacitance, since, with a specific pickup overvoltage, the proportion of capacitive current is small. Assuming the fundamental voltage across the surge arrester is $$v(t) = V_m \sin(\omega_1 t) \qquad (2)$$

Then arrester current can be obtained as $$i_r(\omega_1 t) = \begin{cases} k_a(V_m)^{\alpha_1}(\sin\omega_1 t)^{\alpha_1} \ 0 < V_m \sin(\omega_1 t) \leq V_1, \\ \quad \text{i.e. } \varphi_0 < \omega_1 t \leq \varphi_1 \text{ or } \pi - \varphi_1 \leq \omega_1 t < \pi \\ k_a(V_m)^{\alpha_2}(\sin\omega_1 t)^{\alpha_1} \ V_1 < V_m\sin(\omega_1 t) \leq V_2, \\ \quad \text{i.e. } \varphi_1 < \omega_1 t \leq \varphi_2 \text{ or } \pi - \varphi_2 \leq \omega_1 t < \pi - \varphi_1 \\ \quad \ldots \\ k_a(V_m)^{\alpha_m}(\sin\omega_1 t)^{\alpha_m} \ V_{m-1} < V_m\sin(\omega_1 t) \leq V_m, \\ \quad \text{i.e. } \varphi_{m-1} < \omega_1 t \leq \varphi_m \text{ or } \pi - \varphi_m \leq \omega_1 t < \pi - \varphi_{m-1} \\ -k_a(V_m)^{\alpha_1}(\sin\omega_1 t)^{\alpha_1} \ 0 < V_m\sin(\omega_1 t) \leq -V_1, \\ \quad \text{i.e. } \pi < \omega_1 t \leq \pi + \varphi_1 \text{ or } 2\pi - \varphi_1 \leq \omega_1 t < 2\pi \\ -k_a(V_m)^{\alpha_2}(\sin\omega_1 t)^{\alpha_2} \ -V_1 < V_m\sin(\omega_1 t) \leq -V_2, \\ \quad \text{i.e. } \pi + \varphi_1 < \omega_1 t \leq \pi + \varphi_2 \text{ or } 2\pi - \varphi_2 \leq \omega_1 t < 2\pi - \varphi_1 \\ \quad \ldots \\ -k_a(V_m)^{\alpha_m}(\sin\omega_1 t)^{\alpha_m} \ -V_{m-1} < V_m\sin(\omega_1 t) \leq -V_m, \\ \quad \text{i.e. } \pi + \varphi_{m-1} < \omega_1 t \leq \pi + \varphi_m \text{ or } 2\pi - \varphi_m \leq \omega_1 t < 2\pi - \varphi_{m-1} \end{cases} \qquad (3)$$

where $\varphi_k = \sin^{-1}(V_k/V_m)$, k=0, 1, 2, . . . m, specifically $\varphi_0 = 0$, $\varphi_m = \sin^{-1}(V_m/V_m) = \pi/2$. The frequency components can be derived from a Fourier Series (FS) Analysis. The FS constants are described as $$I_{nm} = \frac{4k_a}{\pi} \sum_{k=1}^{m} \left[ V_m^{\alpha_k} \int_{\varphi_{k-1}}^{\varphi_k} (\sin\omega_1 t)^{\alpha_k} \sin(n\omega_1 t) d\omega_1 t \right] = \frac{4k_a}{\pi} \sum_{k=1}^{m} [C_{nk} V_m^{\alpha_k}], \quad (4)$$

$$n = 1,3,5\ldots$$

Specifically, $$C_{1k} = \cos(\varphi_{k-1}) \times {}_2F_1\left(\frac{1}{2}, \frac{\alpha_k}{2}, \frac{3}{2}, \cos^2(\varphi_{k-1})\right) - \left[\cos(\varphi_k) \times {}_2F_1\left(\frac{1}{2}, \frac{\alpha_k}{2}, \frac{3}{2}, \cos^2(\varphi_k)\right)\right] \quad (5)$$

The arrester current can then be represented as $$i(t) = \sum_{n=1,3,5\ldots} i_n = \sum_{n=1,3,5\ldots} I_{nm} \sin(n\omega_1 t) \quad (6)$$

The ratio of current fundamental component to fundamental voltage can be calculated as $$k_{vn}(V_m) = \frac{I_{nm}}{V_m} = \frac{I_n}{V}, n = 1,3,5\ldots \quad (7)$$

The ratio of current fundamental component to current peak can be calculated as $$k_{in} = \frac{I_{nm}}{I_m} = \frac{\frac{4k_a}{\pi}\sum_{k=1}^{m}[C_{nk}V_m^{\alpha_k}]}{k_a V_m^{\alpha_m}} = \frac{4}{\pi}\sum_{k=1}^{m}[C_{nk}V_m^{\alpha_k - \alpha_m}], n = 1,3,5\ldots \quad (8)$$

Or, more specifically, $$i_1 = k_{v1}(V)\dot{V} = \frac{4k_a}{\pi}\sum_{k=1}^{m}[C_{1k}(\sqrt{2}V)^{\alpha_k - 1}]\dot{V} \quad (9)$$

This shows that with a defined arrester V-I characteristic, the amplitude of current fundamental or harmonic component increases with the increasing fundamental voltage amplitude. Accordingly, a pickup value of current fundamental or any harmonic component amplitude can be set that corresponds to the arrester pickup overvoltage, to achieve TOV/GFOV protection via comparison with the measured current from the arrester. In this example, a multi-segment exponential function is used to describe the arrester V-I characteristic. Other functions may be used to describe the characteristic in other embodiments, and a similar analysis is conducted perform proposed alternative TOV and GFOV protection.

Having calculated the fundamental component of the current, the algorithm for initiating TOV/GFOV protection is as follows.

From (7), the arrester voltage phasor can be estimated by $$\dot{V} = \frac{1}{k_{v1}(I_1)} \times \dot{I}_1 \quad (10)$$

where $k_{v1}(I_1)$ is $k_{v1}$ represented by variable $I_1$. It can be represented by a look-up table, corresponding to the TOV region shown in FIG. 4. There is an angle error between the estimated voltage and actual arrester voltage, which is caused by the effect of stray capacitance. But this is not a significant factor for TOV protection in this example, because stray capacitances of the three-phase arresters are similar, and the proportion of capacitive current is also relatively small in TOV regions.

The pickup RMS of the fundamental current for TOV protection can be set as $$I_{TOV} = \frac{2\sqrt{2}k_a}{\pi} \sum_{k=0}^{m} [C_{1k}(\sqrt{2}V_{TOV})^{\alpha_k}] \quad (11)$$

where $V_{TOV}$ is the pickup RMS voltage for TOV protection. We can also use the voltage estimated from (10) for alternative TOV protection.

The 3V0 (or zero sequence voltage) is typically used for GFOV protection, as shown in FIG. 1. In this example, 3V0 protection is achieved by either a 3I0 (or zero sequence current) algorithm or a 3V0 algorithm. For the 3V0 algorithm, 3V0 is calculated from (10):

$$3V0 = |\dot{V}_A + \dot{V}_B + \dot{V}_C| = \left|\frac{\dot{I}_{1A}}{k_{v1}(I_{1A})} + \frac{\dot{I}_{1B}}{k_{v1}(I_{1B})} + \frac{\dot{I}_{1C}}{k_{v1}(I_{1C})}\right| \quad (12)$$

where $k_{v1}(I_{1A})$, $k_{v1}(I_{1B})$, $k_{v1}(I_{1C})$ are the fundamental voltage-to-current conversion ratio of phase a, b, c separately, which can be obtained from the same look-up table. The pickup 3V0 is the same with traditional 3V0 protection. A derivation of the pickup 3V0 is shown below. A function diagram of the 3V0 algorithm is shown in FIG. 8. The C2V function is a current-to-voltage conversion achieved by (10), subscript * represents the pickup value of the protection.

For a 3I0 algorithm, 3I0 can be calculated by measured three-phase arrester current fundamental components as follows $$3I0 = |i_{1A} + i_{1B} + i_{1C}| \quad (13)$$

The pickup current can be calculated based on traditional 3V0 methodology, which is presented below. FIG. 9 shows a functional diagram of the 3I0 algorithm, in which subscript * represents the pickup value of the protection.

The following analysis is an example of a method for simplifying the arrestor current-to-voltage conversion. A complete arrester V-I characteristic curve (such as that shown in FIG. 4) consists of multiple segments. However, only the segments below pickup voltage are of significant important for TOV/GFOV protection according to embodiments of the invention. Accordingly, the V-I characteristic curve that used for current-to-voltage conversion can be simplified by using 2 segments: the segment below the knee-point voltage 32, and the segment between knee-point voltage and the pickup voltage of 500 kV. The multiple segments below knee-point voltage are simplified by the only segment close to knee point, because of the ignorable low current amplitude of the first several segments. In this embodiment, the accuracy of the V-I characteristic of the segment from the knee-point voltage to the pickup voltage is much more important for an accurate voltage-to-current conversion under overvoltage condition. From (4) and (5) we have $$I_{1m} = \frac{4k_a}{\pi} \sum_{k=1}^{2} [C_{1k} V_m^{\alpha_k}] \qquad (14)$$

$$C_{1k} - \cos(\varphi_{k-1}) \times {}_2F_1\left(\frac{1}{2}, -\frac{\alpha_k}{2}, \frac{3}{2}, \cos^2(\varphi_{k-1})\right) - \left[\cos(\varphi_k) \times {}_2F_1\left(\frac{1}{2}, -\frac{\alpha_k}{2}, \frac{3}{2}, \cos^2(\varphi_k)\right)\right] \qquad (15)$$

where $V_x$ is the knee-point voltage. If the system insulation is designed at a high level, equation (14) may be simplified by using only one segment V-I characteristic. Given the arrester in FIG. 4 is rated at 500 kV, and pickup overvoltage also designed at 500 kV, the corresponding current amplitude will be about 4 mA, while the current amplitude at knee point is only around 4 μA. In this example, only the V-I segment between knee-point voltage and the rated voltage is used to calculate the pickup fundamental current, which is given as $$I_{1m} = \frac{2\Gamma\left(\frac{\alpha_2+2}{2}\right)k_a}{\sqrt{\pi}\Gamma\left(\frac{\alpha_2+3}{2}\right)} V_m^{\alpha_2} \qquad (16)$$

On the other hand, if no overvoltage occurs, only the V-I segment below the knee point is needed to complete current-to-voltage conversion.

A simplified analysis of a circuit such as that shown in FIG. 1 follows, which shows how to determine the pickup setting for 3V0 algorithm-based TOV/GFOV protection. The assumptions used for this analysis include: 1) the transformer and distribution line impedances are ignored, due to the small value comparing with load impedance, 2) the fault occurs on phase A, with phase A voltage angle at zero, 3) transmission system positive, negative and zero sequence impedances are the same, 4) the influence of MO arrester on reducing amplitude of GFOV is ignored, and 5) distribution side DERs consist only of current source type generation, with constant current output to balance the power generation and consumption. This is the premise of an islanding operation and the subsequent GFOV condition. The analysis is conducted based on the three intervals in the fault process.

1) Interval 1: Before the Fault
Based on the assumption 4), from FIG. 1 the total DER currents can be obtained by $$\dot{I}_{LABC} = \frac{\dot{V}_{ABC}}{Z_H // Z_L} \approx \frac{\dot{V}_{SABC}}{Z_H // Z_L} = \frac{Z_H Z_L}{Z_H + Z_L} \dot{V}_{SABC} \qquad (17)$$

where $i_{LABC}$ is lumped DER currents seen from the transmission side, $\dot{V}_{SABC}$ is the three-phase voltage of transmission system source. $Z_L$ is the lumped impedance of $Z_{DH}$ and $Z_{YL}$ seen from the transmission side. Because no zero-sequence current flows through the load $Z_{DH}$ and $Z_{YL}$, they are considered as the same type of load, and thus been lumped into the impedance $Z_L$.

2) Interval 2: Between SLG Fault and the Transmission Line Breaker Tripping
Assuming the SLG fault occurs on phase A, the sequence network in interval 2 is obtained in FIG. 12a. Usually, $Z_H \gg Z_S$, and $Z_L \gg Z_S$, the symmetrical components of transformer delta-side voltages are then estimated by $$\dot{V}_{120D} = \begin{bmatrix} \dot{V}_{1D} \\ \dot{V}_{2D} \\ \dot{V}_{0D} \end{bmatrix} \begin{bmatrix} \frac{3Z_F(Z_H+Z_S)[Z_L Z_S + Z_H(Z_L+Z_S)] + Z_H Z_S [2Z_L Z_S + Z_H(2Z_L+Z_S)]}{3Z_F(Z_H+Z_S)[Z_L Z_S + Z_H(Z_L+Z_S)] + Z_H Z_S [3Z_L Z_S + Z_H(3Z_L+Z_S)]} \\ -\frac{Z_H Z_L Z_S (Z_S + Z_H)}{3Z_F(Z_H+Z_S)[Z_L Z_S + Z_H(Z_L+Z_S)] + Z_H Z_S [3Z_L Z_S + Z_H(3Z_L+Z_S)]} \\ -\frac{Z_H Z_S [Z_L Z_S + Z_H(Z_S + Z_L)]}{3Z_F(Z_H+Z_S)[Z_L Z_S + Z_H(Z_L+Z_S)] + Z_H Z_S [3Z_L Z_S + Z_H(3Z_L+Z_S)]} \end{bmatrix} \qquad (18)$$

$$V_N \approx \frac{1}{3} V_N \begin{bmatrix} 2+K_Z \\ -(1-K_Z) \\ -(1-K_Z) \end{bmatrix}$$

The three-phase voltage on transformer delta side can then be obtained as $$\dot{V}_{ABC} = \begin{bmatrix} \dot{V}_A \\ \dot{V}_B \\ \dot{V}_C \end{bmatrix} \approx \begin{bmatrix} K_Z \\ e^{-j2\pi/3} \\ e^{j2\pi/3} \end{bmatrix} V_N \qquad (19)$$

where $V_N$ is the nominal voltage on transformer delta side, $K_Z = Z_F/(Z_S + Z_F)$, which is close to 1 when the fault impedance is much higher than the system impedance, and close to 0 when the fault impedance approaches zero. $Z_F$ is the ground fault impedance. Equation (18) shows the voltage symmetrical components change with $K_Z$, which is determined by the ratio of fault impedance and system impedance. Both negative and zero sequence components range from 0 to 0.33 pu. Taking the transformer with a Delta/Wye transformer connection as an example, the sequence-domain and phase-domain voltage on transformer wye-side are obtained as $$\dot{V}_{120Y} = \begin{bmatrix} \dot{V}_{1Y} \\ \dot{V}_{2Y} \\ \dot{V}_{0Y} \end{bmatrix} = \frac{1}{3} \frac{V_N}{N_t} \begin{bmatrix} (2+K_Z)e^{-j\frac{\pi}{6}} \\ -(1-K_Z)e^{j\frac{\pi}{6}} \\ 0 \end{bmatrix} \qquad (20)$$

$$\dot{V}_{abcY} = \begin{bmatrix} \dot{V}_a \\ \dot{V}_b \\ \dot{V}_c \end{bmatrix} = T_s \dot{V}_{120Y} = \frac{1}{\sqrt{3}} \frac{V_N}{N_t} \begin{bmatrix} \left(1 + K_Z e^{j\frac{\pi}{3}}\right) e^{-j\frac{\pi}{3}} \\ \left(e^{j\frac{\pi}{6}} + K_Z e^{j\frac{\pi}{6}}\right) e^{-j\frac{5\pi}{6}} \\ \sqrt{3} e^{j\frac{\pi}{2}} \end{bmatrix}$$

3) Interval 3: Between the Transmission Line Breaker Tripping and the DERs Shutting Down The sequence network in interval 3 is presented in FIG. 12b. Similarly, the sequence domain and phase domain voltages are obtained as $$\dot{V}_{120D} = \begin{bmatrix} \dot{V}_{1D} \\ \dot{V}_{2D} \\ \dot{V}_{0D} \end{bmatrix} = V_N \begin{bmatrix} 1 - \frac{k_p - 1}{-3 + 2k_p - 3k_pk_g + 3k_ck_pk_g} \\ \frac{k_p - 1}{-3 + 2k_p - 3k_pk_g + 3k_ck_pk_g} \\ \frac{1}{-3 + 2k_p - 3k_pk_g + 3k_ck_pk_g} \end{bmatrix} \quad (21)$$

$$\dot{V}_{ABC} = \begin{bmatrix} \dot{V}_A \\ \dot{V}_B \\ \dot{V}_C \end{bmatrix} = V_N \begin{bmatrix} 1 - \frac{2k_p - 3}{-3 + 2k_p - 3k_pk_g + 3k_ck_pk_g} \\ \left[1 - \frac{k_p(1\sqrt{3}\,j)/2}{-3 + 2k_p - 3k_pk_g + 3k_ck_pk_g}\right]e^{-j\frac{2\pi}{3}} \\ \left[1 - \frac{k_p(1+\sqrt{3}\,j)/2}{-3 + 2k_p - 3k_pk_g + 3k_ck_pk_g}\right]e^{j\frac{2\pi}{3}} \end{bmatrix}$$

Both $k_c$ and $k_p$ range from 0 to 1. $k_g$ ranges from 0 to infinity. The fault impedance $Z_F$ is zero in case $k_g=0$, and no ground fault if $k_g$ is infinity. The three-phase line-to-ground voltages on transformer delta side are then obtained as The symmetrical components and three-phase voltages of wye-side voltages are calculated by $$\dot{V}_{120Y} = \begin{bmatrix} \dot{V}_{1Y} \\ \dot{V}_{2Y} \\ \dot{V}_{0Y} \end{bmatrix} = \frac{V_N}{N_t} \begin{bmatrix} \left(1 - \frac{k_p - 1}{-3 + 2k_p - 3k_pk_g + 3k_ck_pk_g}\right)e^{-j\frac{\pi}{6}} \\ \frac{k_p - 1}{-3 + 2k_p - 3k_pk_g + 3k_ck_pk_g} e^{j\frac{\pi}{6}} \\ 0 \end{bmatrix} \quad (22)$$

$$\dot{V}_{abc} = \begin{bmatrix} \dot{V}_a \\ \dot{V}_b \\ \dot{V}_c \end{bmatrix} = \frac{V_N}{N_t} \begin{bmatrix} \left[1 + \frac{(1-k_p)(1+e^{j\pi/3})}{-3+2k_p-3k_pk_g+3k_ck_pk_g}\right]e^{-j\frac{\pi}{6}} \\ \left[1 + \frac{(1-k_p)(1+e^{j\pi/3})}{-3+2k_p-3k_pk_g+3k_ck_pk_g}\right]e^{-j\frac{5\pi}{6}} \\ e^{j\frac{\pi}{6}} \end{bmatrix}$$

The influencing factors are defined by $$k_z = \frac{Z_F}{Z_S + Z_F}, \quad (23)$$

$$k_c = \frac{V_N^2/Z_{tol}}{V_N^2/Z_b} = \frac{Z_b}{Z_{tol}},$$

$$k_p = \frac{V_N^2/Z_L}{V_N^2/Z_{tol}} = \frac{Z_{tol}}{Z_L},$$

$$k_g = \frac{Z_F}{Z_b},$$

$$Z_{tol} = \frac{Z_H Z_L}{Z_H + Z_L},$$

$$Z_L = Z_{DH} + Z_{YL} \cdot N_t^2$$

where $V_N$ is the norminal voltage on transformer delta side. Because no zero-sequence current flows through the load $Z_{DH}$ and $Z_{YL}$, they are considered as the same type of load and thus lumped into the impedance $Z_L$.

Equation (21) shows the voltage $V_B$ and $V_C$ obtain maximum at 1.732 when $k_g$ and $k_p$ are 0 and 1 respectively, which means the GFOV will get the maximum at 1.732 pu when fault impedance is zero and there is no wye (ground) connected loads on the transmission side. With a given $k_c$, the transformer delta side sequence-domain and phase-domain voltages are represented in FIGS. 10 and 11 respectively.

FIGS. 10 and 11 show that the change of zero-sequence voltage amplitude matches the change of healthy phase voltage very well. Generally, the zero-sequence voltage increases with increasing overvoltage on healthy phase. So, the 3V0 is appropriate for use for GFOV protection. The pickup voltage of GFOV protection depends on arrester and power system insulation level. For a grounded transmission system such as that shown in FIG. 1, usually, the arrester rating of temporary overvoltage is designed around 1.25 pu to reduce construction cost. By further analysis, we conclude that when $k_c$ ranges from 0.1 to 1, and the zero-sequence voltage $V_{0D}$ is equivalent to or less than 0.4 pu, the amplitude of healthy phase voltages are less than 1.25 pu in all cases. In view of the fact that the zero-sequence voltage in the first interval referred to above is less than 0.33 pu, the GFOV protection shouldn't be initiated in order to keep DERs tied with the grid. The pickup voltage for 3V0 protection can then be set from 1.05 pu to 1.2 pu. With a defined circuit, the pickup voltage can be confirmed further by a more detailed calculation and analysis, with transmission line impedance, transformer impedance, actually circuit insulation level etc. conditions included. If the system is designed with a high insulation level, a high pickup value is then applicable, a time delay or a time-varying pickup curve can also be added to enhance security.

It is also possible to determine the pickup setting for the 3I0 algorithm. Substituting (19) into (9), we get fundamental components of arrester current in the first interval as $$\begin{cases} \dot{I}_{1A} = k_{v1}(V)\dot{V}_A \approx \frac{4k_a}{\pi} C_{11}(\sqrt{2}\,V_N)^{\alpha_1} |K_Z|^{\alpha_1 - 1} K_Z \\ \dot{I}_{1B} = k_{v1}(V)\dot{V}_B \approx \frac{4k_a}{\pi} C_{11}(\sqrt{2}\,V_N)^{\alpha_1} e^{-j2\pi/3} \\ \dot{I}_{1C} = k_{v1}(V)\dot{V}_C \approx \frac{4k_a}{\pi} C_{11}(\sqrt{2}\,V_N)^{\alpha_1} e^{j2\pi/3} \end{cases} \quad (24)$$

In this interval no overvoltage occurs, so only one segment V-I curve is needed for arrester current calculation. The amplitude of phase-to-ground voltages is generally less than the knee-point voltage, and thus 3I0 (zero-sequence current) is quite small.

Substituting (21) into (9), we get the fundamental components of arrester current in the second interval as $$\begin{cases} \dot{I}_{1A} = k_{v1}(V)\dot{V}_A \approx \frac{4k_a}{\pi} C_{11}(\sqrt{2}\,V_N)^{\alpha_1} \left|1 - \frac{2k_p - 3}{-3 + 2k_p - 3k_pk_g + 3k_ck_pk_g}\right|^{\alpha_1-1} \left(1 - \frac{2k_p - 3}{-3 + 2k_p - 3k_pk_g + 3k_ck_pk_g}\right) \\ \dot{I}_{1B} = k_{v1}(V)\dot{V}_B = \frac{4k_a}{\pi} \sum_{k=1}^{2} \left[C_{1k}(\sqrt{2}\,V_N)^{\alpha_k} \left|1 - \frac{k_p(1-\sqrt{3}\,j)/2}{-3 + 2k_p - 3k_pk_g + 3k_ck_pk_g}\right|^{\alpha_k-1} \right] \left(1 - \frac{k_p(1-\sqrt{3}\,j)/2}{-3 + 2k_p - 3k_pk_g + 3k_ck_pk_g}\right) e^{-j\frac{2\pi}{3}} \\ \dot{I}_{1C} = k_{v1}(V)\dot{V}_C = \frac{4k_a}{\pi} \sum_{k=1}^{2} \left[C_{1k}(\sqrt{2}\,V_N)^{\alpha_k} \left|1 - \frac{k_p(1-\sqrt{3}\,j)/2}{-3 + 2k_p - 3k_pk_g + 3k_ck_pk_g}\right|^{\alpha_k-1} \right] \left(1 - \frac{k_p(1-\sqrt{3}\,j)/2}{-3 + 2k_p - 3k_pk_g + 3k_ck_pk_g}\right) e^{j\frac{2\pi}{3}} \end{cases} \quad (25)$$

For the grounded phase A, only one V-I segment is needed for the current calculation. The phase-to-ground voltages of the remaining two un-grounded phases are close to or larger than the knee-point voltage. The arrester currents in those phases are much higher than the arrester current in grounded phase; The currents are also much higher than that in the first interval. Hence 3I0 in the second interval is much higher than that in the first interval, it is an effective way to set a pickup 3I0 current for differentiating the two intervals. With a defined system configuration and MO arrester V-I characteristic, it is effective to set an appropriate pickup current for 3I0 algorithm in a manner similar to pickup voltage setting for the 3V0 algorithm. The procedure includes 1) obtain the sequence components of arrester current in the second interval, 2) analyze how the zero-sequence component and healthy-phase voltages change under various conditions, and 3) based on this analysis, selecting an appropriate pickup 3I0 current, under which the healthy phase voltages will be no more than the overvoltage withstanding capability under any circumstances.

In many embodiments, GFOV protection should be provided by an overvoltage relaying or a 3V0 relaying on the transmission side of the transformer. A high setting of around 120%-130% of nominal voltage is recommended for the overvoltage relays to prevent incorrect tripping on transient overvoltage. As described above, the phase-to-ground voltage to be reduced is considerably below the expected 173% of nominal voltage. From this standpoint, the 3V0 method for detecting such faults according to embodiments of the present invention is more reliable than a direct overvoltage method. Further, the 3V0 or 3I0 is close to zero under normal operation, so the 3V0 or 3I0 pickup value can be set at a relatively low value and still provide for positive detection of a system ground fault. The pickup values should be set high enough to avoid disconnecting DERs before the transmission-line breaker trips, since in this interval 3I0 is quite small. After the transmission line breaker trips, currents and power dissipation of the MO arresters on un-faulted phases will increase dramatically due to the GFOV on the transmission side and the non-linear effect of arrester resistance. In other embodiments, therefore, the pickup current can also be set based on an analysis of power dissipation in the arrestor. 3I0 algorithm also is more reliable for positive detection and protection in some embodiments, so, for instance, it is possible to set pickup 3I0 corresponding to knee-point voltage for a positive protection.

Example 2

Figure 3:
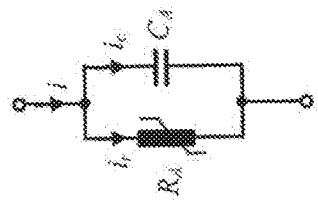
FIG. 3 is a schematic view of a model of a surge arrestor.

This example includes an analysis similar to Example 1, but addresses the capacitance of the arrestor. Again, an arrester can be represented by the simplified model with a stray capacitance and a non-linear resistance in parallel as shown in FIG. 3 and the V-I characteristic of the arrester resistance can be described by a multi-segment function $$i_r = k_a v^{\alpha_k} \quad (26)$$

where subscript $k=1, 2, 3 \ldots$, represents the number of the V-I segment. A full V-I curve contains multiple segments. Assuming fundamental voltage across the surge arrester is $$v(t) = V_m \sin(\omega_1 t) \quad (27)$$

The FS constants of the fundamental and harmonic components are obtained by $$I_{rnm} = \frac{4k_a}{\pi} \sum_{k=1}^{m} \left[ V_m^{\alpha_k} \int_{\phi_{k-1}}^{\phi_k} (\sin\omega_1 t)^{\alpha_k} \sin(n\omega_1 t) d\omega_1 t \right] = \frac{4k_a}{\pi} \sum_{k=1}^{m} [C_{nk} V_m^{\alpha_k}], \quad (28)$$

$$n = 1, 3, 5 \ldots$$

where $\varphi_k = \sin^{-1}(V_k/V_m)$, $k=0, 1, 2, \ldots m$, specifically $\varphi_0 = 0$, $\varphi_m = \sin^{-1}(V_m/V_m) = \pi/2$. The voltage $V_k$ is the voltage of each V-I segment terminal. Specifically, $$C_{1k} = \cos(\varphi_{k-1}) \times {}_2F_1\left(\frac{1}{2}, -\frac{\alpha_k}{2}, \frac{3}{2}, \cos^2(\varphi_{k-1})\right) - \left[\cos(\varphi_k) \times {}_2F_1\left(\frac{1}{2}, -\frac{\alpha_k}{2}, \frac{3}{2}, \cos^2(\varphi_k)\right)\right] \quad (29)$$

The arrester resistance current is then represented as $$i_r(t) = \sum_{n=1,3,5\ldots} i_{rn} = \sum_{n=1,3,5\ldots} I_{rnm} \sin(n\omega_1 t) \quad (30)$$

The ratio of resistive current fundamental to voltage fundamental component is calculated as $$k_{vn}(V) = \frac{I_{rn}}{V} = \frac{I_{rnm}}{V_m}, n = 1, 3, 5 \ldots \quad (31)$$

The ratio of resistive current fundamental component to resistive current peak is $$k_{in} = \frac{I_{rnm}}{I_{rm}} = \frac{\frac{4k_a}{\pi} \sum_{k=1}^{m} [C_{nk} V_m^{\alpha_k}]}{k_a V_m^{\alpha_m}} = \frac{4}{\pi} \sum_{k=1}^{m} [C_{nk} V_m^{\alpha_k - \alpha_m}], \quad (32)$$

$$n = 1, 3, 5$$

The total current fundamental component is then described as, $$I_1 = I_{1r} + I_{1c} = k_{v1}(V)\dot{V} + \frac{\dot{V}}{jX_c} = \frac{4k_a}{\pi}\sum_{k=1}^{m}[C_{1k}(\sqrt{2}V)^{\alpha_k-1}]\dot{V} - j\frac{\dot{V}}{X_c} \quad (33)$$

where $X_c$ is the reactance of the stray capacitance, $I_{1c}$ is the capacitive current. It shows with a defined arrester V-I characteristic, the amplitude of current fundament or harmonic component increases with the increase of fundamental voltage amplitude and the exponent $\alpha_k$. In this embodiment and in others, the pickup current can be a single value or a time-current curve, according to the requirements of the particular installation, which depends on the circuit equipment and arrester overvoltage withstanding capability. Usually, $\alpha_k$ is lower than 10 when the arrester voltage is in the normal range and increases to around 45 when a critical TOV event occurs. This indicates that the arrester current increase significantly when the arrester voltage enters into the TOV region, which provides a distinct signal for TOV or GFOV protection. A positive GFOV protection can then be achieved based on arrester current monitoring and analysis.

An alternative analysis of the voltage variables on which 3V0 protection is based is similar to equations (17)-(22). With a given $k_c$, the amplitudes of sequence-domain and phase-domain voltages on transformer delta side are represented in FIGS. 13 and 14, respectively. The amplitudes of sequence-domain voltages and phase-domain voltages on wye side are represented in FIGS. 15 and 16, respectively. Based on above analysis the fault impact on voltages is summarized in Table 1, along with the influencing factors of transformer voltages where "↑" or "⇑" represents the increase of influencing factor, and the corresponding increase of voltage amplitude as a result of influencing factor increase, "↓" or "⇓" represents the decrease of voltage amplitude as a result of influencing factor increase. Specifically, in interval 3, "↑" or "↓" represents the change of influencing factor $k_g$ or the change of voltage amplitude caused by the change of $k_g$; "⇑" or "⇓" represents the change of $k_p$ or the change of voltage amplitude due to the change of $k_p$. "A-B" represents the variation range from A to B. The influencing factors are defined as $$k_z = \frac{Z_F}{Z_S + Z_F}, \quad (34)$$

$$k_c = \frac{V_N^2/Z_{tol}}{V_N^2/Z_b} = \frac{Z_b}{Z_{tol}},$$

$$k_p = \frac{V_N^2/Z_L}{V_N^2/Z_{tol}} = \frac{Z_{tol}}{Z_L},$$

$$k_g = \frac{Z_F}{Z_b},$$

$$Z_{tol} = \frac{Z_H Z_L}{Z_H + Z_L},$$

$$Z_L = Z_{DH} + Z_{YL} \cdot N_t^2$$

$V_N$ is the norminal voltage on transformer delta side. Because no zero-sequence current flows through the load $Z_{DH}$ and $Z_{YL}$, they are considered as the same type of load and thus lumped into the impedance $Z_L$. The detailed analysis is presented in the Appendix.

TABLE 1

Fault impact on transformer delta-side and wye-side voltages

| Interval | Influencing factor and the change | Voltage Location | Phase Domain Voltage Amplitude and the change (p.u.) | | | Sequence Domain Voltage Amplitude and the change (p.u.) | | |
|---|---|---|---|---|---|---|---|---|
| | | | Phase A | Phase B | Phase C | Positive | Negative | Zero |
| 1 | N/A | Δ & Y Side | 1 | 1 | 1 | 1 | 0 | 0 |
| 2 | $k_z$ (0-1) ↑ | Δ side | 0-1 ↑ | 1 | 1 | 0.667-1 ↑ | 0-0.333 ↓ | 0-0.333 ↓ |
| | | Y side | 0.577-1 ↑ | 0.577-1 ↑ | 1 | 0.667-1 ↑ | 0-0.333 ↓ | 0 |
| 3 | $k_g$ (0-∞) ↑ | Δ side | 0-1 ↑↓ | 1-1.732 ↓⇑ | 1-1.732 ↓⇑ | 0.667-1 ↑⇑ | 0-0.333 ↓⇓ | 0-1 ↓⇑ |
| | $k_p$ (0-1) ⇑ | Y side | 0.577-1 ↑⇑ | 0.577-1 ↑⇑ | 1 | 0.667-1 ↑⇑ | 0-0.333 ↓⇓ | 0 |

Note:
The fault occurs on transformer delta side phase A, the transformer is with D11/Yg connection Table 1 shows that in interval 3 (the interval in which a GFOV may occur), the change of the zero-sequence voltage on transformer delta side caused by the variation of influencing factors is consistent with the change of GFOV on delta-side un-faulted phases. So, the delta side zero-sequence voltage is quite suitable as a monitoring objective for GFOV detection. By further analysis, it is found that in interval 3, when the total loading power is no less than ten percent of the system capacity, and the zero-sequence voltage amplitude on delta side is less than 0.4 pu, the amplitude of the un-faulted phase voltages is always less than 1.25 pu, no matter how large the coefficients $k_g$ and $k_p$ are. Because the zero-sequence voltage amplitude ranges from 0 to 0.33 pu in interval 2, the pickup voltage can be set as larger than 0.33 pu but less than 0.4 pu for GFOV protection (i.e. 3V0 from 1 pu to 1.2 pu), so that misoperation of the GFOV protection due to the zero-sequence voltage present in interval 2 can be avoided.

On the other hand, in this embodiment, none of the changes of sequence-domain or phase-domain voltage amplitudes on wye side is consistent with the change of the GFOV on delta-side un-faulted phases. Moreover, in interval 2 the variation range of sequence-domain or phase-domain voltage amplitudes is also the same with that in interval 3. Because the influencing factors in the two intervals are different, it is inevitable that under some conditions the voltage amplitudes in the two intervals remain unchanged, which means, in this embodiment, there is no way to differentiate the two intervals by the voltage amplitude changes. So it is unlikely to achieve a passive alternative GFOV protection from the wye side. For instance, if $k_g$ is very high and $k_p$ is equal to 1, the wye-side voltage amplitudes keep almost unchanged or have ignorable changes in the fault process. However, GFOV may still occur.

Example 3

A third process for identifying the desired components of the measured current signal is as follows, with reference again to the V-I curve in FIG. 4. Again, an arrester resistor V-I characteristic can be described as a multi-segment function $$v = k_i(i_r)^{1/\alpha_i} \tag{35}$$

or $$i_r = \left(\frac{1}{k_i}v\right)^{\alpha_i} \tag{36}$$

where i=1, 2, 3 . . . , are segment numbers of the V-I curve, with a defined voltage $V_m \sin(\omega_n t)$, the resistive current component flowing through the MOA resistor can be obtained as $$i_r(\omega_n t) = \tag{37}$$

$$\begin{cases} \left(\frac{1}{k_i}V_m\sin\omega_n t\right)^{\alpha_i} = \left(\frac{1}{k_i}V_m\right)^{\alpha_i}(\sin\omega_n t)^{\alpha_i} \quad 0 \le \omega_n t \le \pi \\ -\left(\frac{1}{k_i}V_m\sin(\omega_n t - \pi)\right)^{\alpha_i} = -\left(\frac{1}{k_i}V_m\right)^{\alpha_i}(\sin\omega_n t - \pi)^{\alpha_i} \quad \pi \le \omega_n t \le 2\pi \end{cases}$$

The frequency components can be derived from Fourier Series (FS) Analysis. The FS constants are described as $$\begin{cases} a_0 = \frac{1}{\pi}\int_{-\pi}^{\pi} i(\omega_n t)d\omega_n t = 0 \\ a_n = \frac{1}{\pi}\int_{-\pi}^{\pi} i(\omega_n t)\cos(n\omega_n t)d\omega_n t = 0 \\ b_n = \frac{1}{\pi}\int_{-\pi}^{\pi} i(\omega_n t)\sin(n\omega_n t)d\omega_n t = \left(\frac{1}{k_i}V_m\right)^{\alpha_i}\frac{2}{\pi}\sum_{i=1,2...}\int_0^{\omega_n t_i}(\sin\omega_n t)^{\alpha_i}\sin(n\omega_n t)d\omega_n t \end{cases} \tag{38}$$

Although a complete V-I curve contains multiple segments, the first or first two segments can be ignored because of the low current amplitude, which is generally from 1 μA to 0.1 mA. So FS constants are obtained by using the only segment containing leakage current under related voltage (usually it is around 1 mA). In this example, the amplitude of resistive fundamental and $5^{th}$ component are $$i_{r1m} = b_1 = \left(\frac{1}{k}V_m\right)^\alpha \frac{2}{\pi}\sum_{i=1,2...}\int_0^{\omega_n t_i}(\sin\omega_n t)^\alpha \sin(\omega_n t)d\omega_n t = \tag{39}$$

$$\left(\frac{V_m}{k}\right)^\alpha \frac{2\Gamma\left(\frac{\alpha+2}{2}\right)}{\sqrt{\pi}\,\Gamma\left(\frac{\alpha+3}{2}\right)}$$

$$i_{r5m} = b_5 = \left(\frac{1}{k}V_m\right)^\alpha \frac{2}{\pi}\sum_{i=1,2...}\int_0^{\omega_n t_i}(\sin\omega_n t)^\alpha \sin(5\omega_n t)d\omega_n t = \tag{40}$$

$$\left(\frac{V_m}{k}\right)^\alpha \frac{(\alpha-3)(\alpha-1)2\Gamma\left(\frac{\alpha+2}{2}\right)}{2\sqrt{\pi}\,\Gamma\left(\frac{\alpha+7}{2}\right)}$$

The amplitude of full arrester resistive current can be expressed as $$i_{rm} = \left(\frac{V_m}{k}\right)^\alpha \tag{41}$$

So the ratio of resistive fundamental/$5^{th}$ component amplitude to full current amplitude is $$k_{i1} = \frac{i_{r1m}}{i_{rm}} = \frac{2\Gamma\left(\frac{\alpha+2}{2}\right)}{\sqrt{\pi}\,\Gamma\left(\frac{\alpha+3}{2}\right)} \tag{42}$$

$$k_{i5} = \frac{i_{r5m}}{i_{rm}} = \frac{(\alpha-3)(\alpha-1)2\Gamma\left(\frac{\alpha+2}{2}\right)}{2\sqrt{\pi}\,\Gamma\left(\frac{\alpha+7}{2}\right)} \tag{43}$$

Thus, the ratio is only dependent on α. By using (42) or (43), the critical amplitude can be identified from measured resistive fundamental or $5^{th}$ component. Vice versa, we can then detect an overvoltage event if the amplitude of fundamental or 5th component exceeds the corresponding threshold. 3V0 protection is based on the zero-sequence voltage component, which can be calculated as $$3V_0 = v_a + v_b + v_c \tag{44}$$

When zero-sequence component $3V_0$ exceeds the threshold $V_{OT}$, a 3V0 protection will be initiated. Similarly, the zero-sequence current component can be calculated as $$3I_0 = i_a + i_b + i_c \tag{45}$$

A 3I0 current threshold corresponding to 3V0 protection can be obtained as $$I_{OT1} = V_{OT}k_{i1}\left[\frac{I_{TOVm}}{\sqrt{2}\,V_{TOV}}\right] \text{ for fundamental based } 3I0 \tag{46}$$

$$I_{OT5} = V_{OT}k_{i5}\frac{I_{TOVin}}{\sqrt{2}\,V_{TOV}} \text{ for 5th component based } 3I0 \tag{47}$$

where $V_{TOV}$ is the arrester TOV withstanding, which can be a fixed value, or a variable changed with time. Then a 3I0 protection corresponding to 3V0 is achieved.

Referring again to FIG. 3, an arrestor includes a stray capacitance, and detecting leakage resistive current can be difficult when capacitive current is dominant. Thus, two different ways for arrester current measurement and GFOV protection can be used in this example, depending on how large capacitive component will be.

1) Fundamental component based GFOV protection will be used if under critical TOV the resistive component is dominant. In this case the GFOV detection won't be interfered by capacitive component.

2) 5th component based GFOV protection will be used if under critical TOV arrester the capacitive component is dominant. In this case the GFOV detection will be interfered by the capacitive component.

In order to set the relay for 3I0 protection in this embodiment, the filter output currents can be calculated by $$i_{fabc} = \begin{cases} k_{CT}k_{t1}[I_{cm}\angle(\varphi_{vabc}+90°)+I_{rm}\angle\varphi_{vabc}] = k_{CT}\sqrt{I_{cm}^2+(k_{i1}I_{rm})^2}\angle\left(\varphi_{vabc}+\arctan\frac{I_{cm}}{k_{i1}I_{rm}}\right), & f=f_n, \text{with1storderfilter} \\ k_{CT}k_{i5}I_{rm}\angle(5\varphi_{vabc}), & f=5f_n, \text{with5thorderfilter} \end{cases} \quad (48)$$

where $k_{CT}$ is the current transformer (CT) current ratio, $I_{cm}$ and $I_{rm}$ is the amplitude of arrester capacitive and resistive current respectively. They can be estimated by $$\begin{cases} I_{rm} = \left(\frac{V_m}{k}\right)^\alpha \\ I_{cm} = \frac{V_m}{\omega_n C_A} \end{cases} \quad (49)$$

For current relaying 3I0, the relay input current can be obtained as $$i_{relay} = 3I_0 = i_{fa}+i_{fb}+i_{fc} = \begin{cases} k_{CT}\left(\sqrt{k_{i1}^2\left(\frac{V_{ma}}{k}\right)^{2\alpha}+\left(\frac{V_{ma}}{\omega_n C_A}\right)^2}\angle\left(\varphi_{va}+\arctan\frac{I_{cma}}{k_{i1}I_{rma}}\right)+\sqrt{k_{i1}^2\left(\frac{V_{mb}}{k}\right)^{2\alpha}+\left(\frac{V_{mb}}{\omega_n C_A}\right)^2}\angle\left(\varphi_{vb}+\arctan\frac{I_{cmb}}{k_{i1}I_{rmb}}\right)+\sqrt{k_{i1}^2\left(\frac{V_{mc}}{k}\right)^{2\alpha}+\left(\frac{V_{mc}}{\omega_n C_A}\right)^2}\angle\left(\varphi_{vc}+\arctan\frac{I_{cmc}}{k_{i1}I_{rmc}}\right)\right) & f=f_n \\ k_{CT}k_{i5}\left[\left(\frac{V_{ma}}{k}\right)^\alpha\angle(5\varphi_{va})+k_{CT}k_{i5}\left(\frac{V_{mb}}{k}\right)^\alpha\angle(5\varphi_{vb})+k_{CT}k_{i5}\left(\frac{V_{mc}}{k}\right)^\alpha\angle(5\varphi_{vc})\right] & f=5f_n \end{cases} \quad (50)$$

Under normal condition $i_{relay}$ equals zero, while with GFOV, the zero-sequence will increase greatly. Suppose the maximal TOV is $V_{TOV}$, threshold RMS value of traditional 3V0 is $V_{0t}$, i.e.

$$V_{0T}=k_{3V0}3V_0=k_{3V0}(v_a+v_b+v_c)=k_{3V0}(V_{ma}\angle\varphi_{va}+V_{mb}\angle_{vb}+V_{mc}\angle\varphi_{vc}) \quad (51)$$

Then the threshold value of 3I0 protection can be obtained by $$I_{0T} = \begin{cases} V_{0t}k_{CT}\sqrt{k_{i1}^2\left[\frac{1}{\sqrt{2}\,V_{TOV}}\left(\frac{\sqrt{2}\,y_{TOV}}{k}\right)^\alpha\right]^2+\left(\frac{1}{\omega_n C_A}\right)^2} & \text{with fundamental filter} \\ \frac{V_{0t}k_{CT}k_{i5}}{\sqrt{2}\,V_{TOV}}\left(\frac{\sqrt{2}\,y_{TOV}}{k}\right)^\alpha & \text{with 5th filter} \end{cases} \quad (52)$$

or $$I_{0T} = \begin{cases} V_{0t}k_{CT}\sqrt{k_{i1}^2\left[\frac{I_{TOVm}}{\sqrt{2}\,V_{TOV}}\right]^2+\left(\frac{1}{\omega_n C_A}\right)^2} & \text{with fundamental filter} \\ V_{0t}k_{CT}k_{i5}\frac{I_{TOVm}}{\sqrt{2}\,V_{TOV}} & \text{with 5th filter} \end{cases} \quad (53)$$

if capacitive current is ignorable, then $$I_{0t} = \begin{cases} V_{0t}k_{CT}k_{i1}\left[\dfrac{I_{TOVm}}{\sqrt{2}\,V_{TOV}}\right] & i\text{th fundamental filter} \\ V_{0t}k_{CT}k_{i5}\dfrac{I_{TOVm}}{\sqrt{2}\,V_{TOV}} & \text{with 5th filter} \end{cases} \quad (54)$$

where $V_{TOV}$ can be a single value, or a curve of $V_{TOV}(t)$. For the latter relay setting will be a threshold curve with the variable of time.

Although the invention has been described with reference to particular examples, embodiments, features, and arrangements of features, these are not intended to limit the scope of the invention.

What is claimed is:

1. A method for initiating overvoltage protection in an electric power system, the method comprising:
   measuring current passing through a surge arrestor;
   calculating one or more frequency components of the measured current by performing a Fast Fourier Transform algorithm comprising calculating one or more Fourier Series constants for the one or more frequency components of the measured current based on one or more segments of a V-I characteristic curve for the surge arrestor;
   using the calculated one or more frequency components to calculate a magnitude of one or more target current variables;
   comparing the magnitude of the one or more target current variables to an overvoltage capability of the arrestor; and
   if the magnitude of the one or more target current variables exceeds the overvoltage capability of the arrestor, initiating overvoltage protection in the electric power system.

2. The method of claim 1, wherein the Fast Fourier Transform algorithm includes using the one or more Fourier Series constants and derived ratios of the one or more frequency components of the measured current to one or more frequency components of voltage in the surge arrestor and of the one or more frequency components of the measured current to a current peak to calculate the one or more frequency components of the measured current.

3. The method of claim 1, wherein the step of comparing a magnitude of the one or more target current variables to an overvoltage capability of the arrestor further comprises the steps of:
   calculating a pickup current using a pickup voltage and the one or more Fourier series constants;
   comparing the magnitude of the one or more target current variables to the pickup current; and
   wherein the step of initiating overvoltage protection comprises initiating TOV protection.

4. The method of claim 1,
   wherein the step of using the calculated one or more frequency components to calculate a magnitude of the one or more target current variables comprises calculating a magnitude of a zero sequence component in the measured current;
   wherein the step of comparing the magnitude of the one or more current variables to an overvoltage capability of the arrestor comprises comparing the magnitude of the zero sequence component to an overvoltage capability of the arrestor; and
   wherein the step of initiating overvoltage protection comprises initiating GFOV protection.

5. The method of claim 1, wherein the step of initiating overvoltage protection further comprises sending a signal to a distribution protection system to initiate breaking one or more circuits in the electric power system.

6. A system for initiating overvoltage protection in an electric power system, comprising:
   a current sensing device adapted to be coupled to a surge arrestor component of the power system;
   one or more processors;
   one or more data storage devices, in communication with the one or more processors, and containing a set of programming instructions for execution by the one or more processors, the set comprising instructions for:
   receiving a measurement of current passing through the surge arrestor;
   calculating one or more frequency components of the measured current by performing a Fast Fourier Transform algorithm comprising calculating one or more Fourier Series constants for the one or more frequency components of the measured current based on one or more segments of a V-I characteristic curve for the surge arrestor;
   using the calculated one or more frequency components to calculate a magnitude of one or more target current variables;
   comparing the magnitude of the one or more target current variables to an overvoltage capability of the surge arrestor; and
   if the magnitude of the one or more target current variables exceeds the overvoltage capability of the arrestor, initiating overvoltage protection in the electric power system.

7. The system of claim 6, wherein the surge arrestor is a metal oxide surge arrestor.

8. The system of claim 7, wherein the current sensing device comprises one or more current transformers or current sensors adapted to measure current in a three-phase electric power system in the range from about 0.1 mA to about 20 mA and is adapted to be coupled between a voltage barrier of the arrestor and a ground terminal associated with the arrestor.

9. The system of claim 6, wherein the instructions for initiating overvoltage protection further comprise sending a signal to a distribution protection system associated with the electric power system to initiate breaking one or more circuits in the electric power system.

10. The system of claim 6, further comprising a relay in communication with the one or more processors; and
    wherein the instructions for initiating overvoltage protection further comprise sending a signal to initiate breaking one or more circuits in the electric power system; and
    wherein the relay is adapted to receive the signal and break one or more circuits in the electric power system.

11. The system of claim 6, wherein the instructions for calculating one or more frequency components of the measured current further comprises:
    using the one or more Fourier Series constants and derived ratios of the one or more frequency components of the measured current to one or more frequency components of voltage in the surge arrestor and of the one or more frequency components of the measured current to a current peak to calculate the one or more frequency components of the measured current.

12. The system of claim 6, wherein the instructions for comparing a magnitude of the one or more target current variables to an overvoltage capability of the arrestor further comprises instructions for:
    calculating a pickup current using a pickup voltage and the one or more Fourier series constants; and
    comparing the magnitude of the one or more target current variables to the pickup current; and
    wherein the instructions for initiating overvoltage protection comprises initiating TOV protection.

13. The system of claim 6,
    wherein the instructions for using the calculated one or more frequency components to calculate a magnitude of one or more target current variables comprises calculating a magnitude of a zero sequence component in the measured current;
    wherein the instructions for comparing the magnitude of the one or more current variables to an overvoltage capability of the arrestor further comprises comparing the magnitude of the zero sequence component to an overvoltage capability of the arrestor; and
    wherein the step of initiating overvoltage protection comprises initiating GFOV protection.

14. A computer program product for initiating overvoltage protection in an electric power system, embodied on a computer readable medium and comprising a set of programming instructions for:
    receiving a measurement of current passing through a surge arrestor in the electric power system in the form of a measured current signal;
    calculating one or more frequency components of the measured current signal by performing a Fast Fourier Transform algorithm comprising calculating one or more Fourier Series constants for the one or more frequency components of the measured current signal based on one or more segments of a V-I characteristic curve for the surge arrestor;
    using the calculated one or more frequency components to calculate a magnitude of one or more target current variables;
    comparing a magnitude of the one or more target current variables to an overvoltage capability of the surge arrestor; and
    if the magnitude of the one or more target current variables exceeds the overvoltage capability of the arrestor, initiating overvoltage protection in the electric power system.

15. The computer program product of claim 14, wherein the instructions for initiating overvoltage protection further comprise sending a signal to a distribution protection system associated with the electric power system to initiate breaking one or more circuits in the electric power system.

16. The computer program product of claim 14, wherein the instructions for calculating one or more frequency components further comprises:
    using the one or more Fourier Series constants and derived ratios of the one or more frequency components of the measured current signal to one or more frequency components of voltage in the surge arrestor and of the one or more frequency components of the measured current signal to a current peak to calculate the one or more frequency components of the measured current;
    calculating a pickup current using a pickup voltage and the one or more Fourier series constants; and
    comparing the magnitude of the one or more target current variables to the pickup current.

17. The computer program product of claim 14, wherein the instructions for calculating one or more frequency components further comprises:
    using the one or more Fourier Series constants and derived ratios of the one or more frequency components of the measured current signal to one or more frequency components of voltage in the surge arrestor and of the one or more frequency components of the measured current signal to a current peak to calculate the one or more frequency components of the measured current;
    wherein the instructions for using the calculated one or more frequency components to calculate a magnitude of one or more target current variables comprises calculating a magnitude of a zero sequence component in the measured current; and
    wherein the instructions for comparing the magnitude of the one or more target current variables to an overvoltage capability of the arrestor further comprises comparing the magnitude of the zero sequence component to an overvoltage capability of the arrestor; and
    wherein the step of initiating overvoltage protection comprises initiating GFOV protection.

* * * * *